US009322857B2

(12) United States Patent
Mittelmeier et al.

(10) Patent No.: US 9,322,857 B2
(45) Date of Patent: Apr. 26, 2016

(54) DETERMINING THE ENERGY YIELD LOSS OF A WIND TURBINE

(71) Applicant: REpower Systems SE, Hamburg (DE)

(72) Inventors: Niko Mittelmeier, Hamburg (DE); Matthias Bergmann, Hamburg (DE); Tomas Blodau, Berlin (DE); Alexander Schubert, Kiel (DE)

(73) Assignee: SENVION SE, Hamburg (DE)

( * ) Notice: Subject to any disclaimer, the term of this patent is extended or adjusted under 35 U.S.C. 154(b) by 170 days.

(21) Appl. No.: 14/184,080

(22) Filed: Feb. 19, 2014

(65) Prior Publication Data

US 2014/0172330 A1 Jun. 19, 2014

Related U.S. Application Data

(63) Continuation of application No. PCT/EP2012/003447, filed on Aug. 13, 2012.

(30) Foreign Application Priority Data

Aug. 19, 2011 (DE) .......................... 10 2011 081 241

(51) Int. Cl.
*G01R 21/133* (2006.01)
*G01M 15/00* (2006.01)
(Continued)

(52) U.S. Cl.
CPC .............. *G01R 21/133* (2013.01); *F03D 7/048* (2013.01); *F03D 11/0091* (2013.01); *G01M 15/00* (2013.01); *F05B 2270/20* (2013.01); *Y02E 10/722* (2013.01); *Y02E 10/723* (2013.01)

(58) Field of Classification Search
CPC ..... G01R 21/133; G01M 15/00; F03D 7/048; F03D 7/0204; F03D 7/0272; F03D 7/2092; F03D 7/046; F03D 7/0224; F03D 7/028; F03D 7/042; F03D 7/04; F03D 7/02; F03D 7/022; F03D 7/0276; F03D 11/0091; F05B 2270/20; F05B 2270/1033; F05B 2270/32; F05B 2270/3201; F05B 2240/96; H02P 9/48; H02P 9/04; Y02E 10/726
See application file for complete search history.

(56) References Cited

U.S. PATENT DOCUMENTS

2006/0119105 A1* 6/2006 Kang ...................... H02P 9/009
290/44
2008/0001409 A1* 1/2008 Schellings ............ F03D 7/0204
290/44

(Continued)

FOREIGN PATENT DOCUMENTS

DE 102004056254 6/2006
EP 0847496 6/1998
(Continued)

OTHER PUBLICATIONS

International Search Report filed in PCT/EP2012/003447.
(Continued)

*Primary Examiner* — Manuel L Barbee
(74) *Attorney, Agent, or Firm* — Rankin, Hill & Clark LLP

(57) ABSTRACT

A method for determining an energy yield loss of a first wind turbine of a wind farm that includes a plurality of wind turbines. The first wind turbine is operated in a reduced energy yield mode that is outside an energy-optimized normal operating mode and a reduced energy yield of the first wind turbine is determined. At least one second wind turbine is selected according to a pre-determinable criterion. The energy yield of the at least one second wind turbine is determined and depending upon the energy yield of the at least one second wind turbine, an energy yield potential of the first wind turbine is determined. The difference between the energy yield potential of the first wind turbine and the determined reduced energy yield is formed.

13 Claims, 5 Drawing Sheets

(51) Int. Cl.
    *F03D 7/04*     (2006.01)
    *F03D 11/00*     (2006.01)

(56) References Cited

U.S. PATENT DOCUMENTS

2009/0066089 A1* 3/2009 Arinaga ............... F03D 7/0224
                                                    290/55
2010/0115951 A1   5/2010  Pedersen

FOREIGN PATENT DOCUMENTS

EP     1944509     7/2008
EP     2028368     2/2009
EP     2354541     8/2011

OTHER PUBLICATIONS

Citation of Erich Hau "Windkraftanlagen", p. 546, picture 14.5 (discussed in Specification).

* cited by examiner

DETERMINING THE ENERGY YIELD LOSS OF A WIND TURBINE

BACKGROUND OF THE INVENTION

1. Field of the Invention

The invention relates to a method for determining an energy yield loss of a first wind turbine of a wind farm comprising a plurality of wind turbines.

2. Description of Related Art

Particularly in the case of large wind farms it is desirable to offer a customer an energy yield guarantee instead of an availability guarantee. Here, in the case of a failure of a wind turbine, or respectively merely a reduced power output of a wind turbine, that is, a wind turbine that is operated in a reduced energy yield mode, it is however difficult to quantify the lost energy yield. Here, the lost energy yield is the difference between the actual possible energy yield in the case of an energy-optimized normal operating mode and the actual energy yield of a wind turbine, which is operated in a reduced energy yield mode or even fails, or respectively is operated without energy yield. It is, however, difficult to determine the actual energy yield that would be possible in an energy-optimized normal operating mode. For this purpose an exact wind strength profile based on location and time at the wind turbine, which is operated in a reduced energy yield mode, would have to be created which is impossible to do exactly, and can be approximated with known methods, such as for example, a nacelle anemometer or a plurality of nacelle anemometers in the region of the wind turbine, only in a very inaccurate way.

With an existing wind measurement mast in the proximity of the wind turbine or the wind farm, using an existing wind turbine power curve, the energy yield can be calculated with the assumption that the wind in the rotor plane corresponds to the wind at the measurement mast. This method is however based on the assumption that does not correspond to reality, and in particular in the case of wind farms, is also too imprecise. In addition, the approach to use the nacelle anemometer of the wind turbine operated in reduced energy yield mode is too imprecise, because the anemometer measurement is strongly distorted by the nacelle and possibly also the rotor blades of wind turbines, which are present in close proximity.

BRIEF SUMMARY OF THE INVENTION

It is the object of the present invention to specify a method for determining the energy yield loss of a first wind turbine of a wind farm comprising a plurality of wind turbines, wherein the first wind turbine is operated in a reduced energy yield mode, that allows a more accurate determination of the energy yield loss.

This object is solved by a method for determining an energy yield loss of a first wind turbine of a wind farm comprising a plurality of wind turbines, wherein the first wind turbine is operated in a reduced energy yield mode that is outside an energy-optimized normal operating mode, wherein a reduced energy yield of the first wind turbine is determined, wherein at least one second wind turbine is selected according to a pre-determinable criterion, wherein the energy yield of the at least one second wind turbine is determined, wherein depending upon the energy yield of the at least one second wind turbine an energy yield potential of the first wind turbine is determined and the difference between the energy yield potential of the first wind turbine and the determined reduced energy yield is formed.

The energy yield loss of the first wind turbine is then the difference between the energy yield potential of the first wind turbine and the determined reduced energy yield, thus in particular, the measured energy yield of the first wind turbine. An energy-optimized normal operating mode is understood to be an operating mode of a wind turbine which aims to generate an optimal quantity of energy, or respectively optimal power of the wind turbine. This is then, above a rated wind speed, the operating mode of the wind turbine at rated power, and below the rated wind speed is usually an operating mode in which the energy yield, or respectively the generated power, increases with increasing wind strength. Upon attaining the rated power then, a full load mode is attained, and before attaining the rated power, or respectively the rated wind speed, a partial load operating mode is attained, wherein the partial load operating mode also represents an energy-optimized normal operating mode. Customary characteristic curves are shown for example in image 14.5 on page 546 of the textbook by Erich Hau, entitled "Windkraftanlagen" (Wind Power Plants), 4th edition, Springer-Verlag, Berlin, Heidelberg.

The image 14.5 on page 546 of the textbook by Erich Hau shows multiple operating mode characteristic curves for the partial load and full load operating range in the rotor power characteristic diagram of a wind turbine. The rotor power coefficient is plotted over the tip speed ratio. The power, which is delivered by the wind turbine, figures in the rotor power coefficient, and the wind speed figures in the tip speed ratio. In this example embodiment, an operating characteristic curve is followed in which the pitch angle of the rotor blades of the wind turbine is set to 5° initially at high tip speed ratio, that is, at low wind speed (see the thick dotted line). From a certain tip speed ratio of approximately 12.5 onwards, the generator is switched on, that is, the wind turbine is then in partial load operating mode. Here, higher power is produced with increasing speed, wherein the pitch angle remains at 5°. Above the rated operating point, the wind turbine goes into full load operating mode, wherein with increasing wind strength the pitch angle is adjusted to greater angles. Above a cut-off wind speed with a pitch angle of approximately 27°, the wind turbine is switched off. There are also variants in which the wind turbine is not yet switched off at a cut-off wind speed, but rather, initially is further operated at reduced power with a greater rotor blade angle, or respectively, pitch angle in order to still produce power. This can also represent an energy-optimized normal operating mode. In the scope of the invention, an energy-optimized normal operating mode is therefore the example progression shown in the image 14.5 on page 546 in the textbook by Erich Hau. A reduced energy yield mode is a progression that lies below this characteristic curve, thus producing less energy, or respectively power, typically because a higher blade angle, or respectively pitch angle, is set.

Preferably, at least two second wind turbines are selected or are respectively selected, wherein the energy yield of the at least two second wind turbines is determined, wherein depending on the energy yields of the at least two second wind turbines an energy yield potential of the first wind turbine is determined. If the method is correspondingly expanded with at least two second wind turbines, a more accurate result of the determination of the energy yield potential of the first wind turbine is expected.

The at least one second wind turbine or the at least two second wind turbines is, or are, preferably operated in an energy-optimized normal operating mode.

Correspondingly, reference is also made to the document EP 0 847 496 B1, in which FIG. 1 shows characteristic curves which serve to specify for the operating control how to run, for instance, the power curve over the wind speed. With respective running, or respectively operating, of the wind turbine on the characteristic curve, the power over the wind speed shown in FIG. 1, this is also an energy-optimized normal operating mode. With an operating mode of the first wind turbine which has a reduced energy yield mode, an operating mode would be provided which would be below the characteristic curve of the power over the wind speed. Here, in particular, this can preferably be a standstill or a powerless operation of the first wind turbine.

The method is in particular efficient when the energy yields of the at least two second wind turbines are interpolated, extrapolated, or averaged for the determination of the energy yield potential of the first wind turbine. In particular, averaging provides a realistic value for the energy yield potential of the first wind turbine. With this, in particular a weighted average value can also be used, when for example, a projection of the energy yield of the respective second wind turbines is known based on stored empirical values with determined environmental parameters, for instance the wind direction and/or the wind strength, which leads to an exact determination of energy yield potential of the first wind turbine. A projection can be preferably performed when it is known that with a predetermined environmental parameter, the energy yield of a second wind turbine is more similar than a further second wind turbine. A determination of the energy yield potential can be made particularly simply using interpolation. It can also make sense to extrapolate the corresponding energy yields of the at least two second wind turbines, in particular, when for certain environmental parameters, or respectively with at least one environmental parameter, a ratio of the energy yields of the at least two second wind turbines to the first wind turbine is known or respectively determined and/or saved.

The method is particularly preferred when this is performed automatically, in particular completely automatically. In the scope of the invention, completely automatically is understood to mean that the method is initiated completely automatically as soon as a first wind turbine is operated outside of an energy-optimized normal operating mode, i.e. in a reduced energy yield mode. Automatic comprises that the method is performed automatically after initiation by an operator.

Preferably the operation of the first wind turbine in a reduced energy yield mode is at standstill or powerless operation, for example rolling operation of the first wind turbine.

Preferably the wind farm is divided into at least a first and a second group of wind turbines, wherein the first wind turbine and the at least one second wind turbine are in the same group, or the first wind turbine and the at least two second wind turbines are in the same group. In this case, the criterion for the selection of the at least two second wind turbines is that the second wind turbines belong to the group to which the first wind turbine belongs.

Preferably the first group of wind turbines comprises wind turbines with freely inflowing wind and the second group of wind turbines comprises wind turbines with disrupted inflowing wind. The wind turbines with disrupted inflowing wind are wind turbines that are disrupted by further wind turbines with respect to the inflowing wind. A disruption arises for example due to a wake flow or wake turbulence of further wind turbines. Wind turbines with freely inflowing wind are for example those which, based on a predetermined wind direction, are the first wind turbines that are encountered by the wind. The wind turbines arranged behind these are typically wind turbines with disrupted inflowing wind because these lie in the turbulence zone of the wind turbines with freely inflowing wind.

If the first wind turbine belongs to the group of the wind turbines with freely inflowing wind, then at least one second wind turbine, or the at least two second wind turbines also belong to this group. Conversely, the second wind turbines belong to the group of the wind turbines with disrupted inflowing wind, when the first wind turbine also belongs to the group of wind turbines with disrupted inflowing wind. In this case, it is particularly preferable if an average value of the energy yields of the respective group of wind turbines is formed, and this average value from the second wind turbines from this group of wind turbines is applied as the energy yield potential of the first wind turbine. Which wind turbine belongs to the wind turbines with disrupted inflowing wind, and which belongs to the wind turbines with undisrupted inflowing wind, or respectively freely inflowing wind, depending on the wind direction, can be calculated according to a formula, which is specified in the scope of the following description of the figures. Preferably, all second wind turbines of the corresponding group are used for the determination of an average value of the energy yield in order to determine the energy yield potential of the first wind turbine.

Alternatively, or respectively additionally, preferably an energy yield ranking list of the wind turbines of the wind farm can be or has been formed. The energy yield ranking list concerns the energy yield, or respectively power yield, of the respective wind turbine in the energy-optimized normal operating mode, in order to be able to provide a respective comparison. The energy yield ranking list can be formed, or respectively measured, as a multidimensional matrix, in particular depending on different wind directions and/or different wind strengths.

By creating an energy yield ranking list it is possible in a particularly simple manner to determine an energy yield potential of the first wind turbine, for example in that the energy yield of one, or at least two, second wind turbines is considered in order to specify the energy yield potential of the first wind turbine. For this purpose, preferably the at least one second wind turbine or the at least two second wind turbines considered in the energy yield ranking list is or are neighboring the energy yield of the first wind turbine. Here, immediate neighbors can be considered as well as neighbors lying more remotely. Then, the energy yield potential of the first wind turbine can also simply be an average value of the wind yields of the neighboring second wind turbines, for example. In this case, the criterion for selecting the at least two second wind turbines is that they are energy yield neighbors to the first wind turbine. It should be considered that for forming the energy yield ranking list, preferably all wind turbines of the wind farm are not operated in a reduced energy yield load, but rather in an energy-optimized normal operating mode. The ranking list is preferably stored in the respective operating control system of the wind turbine, or respectively in a higher order control system for the wind farm.

As already mentioned, is preferable that the energy yield potential of the first wind turbine depends on at least one environmental parameter. The environmental parameter can be the wind direction, wind strength, air density, a predominant turbulence and/or a wind gradient.

Preferably only second wind turbines that are operated in an energy-optimized normal operating mode are used for determining the energy yield potential of the first wind turbine.

Preferably a comparatively low standard deviation of the determined effective power of the second wind turbine compared to at least one further second wind turbine is provided as a criterion for the selection of a second wind turbine, in particular an additional criterion. The corresponding second wind turbines, which have a standard deviation in energy yield, or respectively power yield, that is too large, are excluded for the determination of the energy yield potential of the first wind turbine, in order to correspondingly increase the accuracy of the determination of the energy yield potential of the first wind turbine.

Preferably, a matrix is or will be created which specifies the energy yield ranking list depending on the wind direction. Preferably, a matrix is or will be created which specifies the energy yield ranking list depending on a further environmental parameter. The matrix can have for example an energy yield ranking list for different wind directions in 5° intervals, or larger or smaller degree intervals. In addition, the matrix can additionally have the energy yield ranking list depending on the wind strengths in intervals of 1 m/s or more or less larger intervals. Additionally, the air density can be added as a further parameter in the matrix. The thusly resulting measured values are then respectively stored and can be adaptively and continuously modified and optimized depending on the prevailing environmental parameters. Preferably a continuously improving learning system results, with which very accurate an energy yield loss of a first wind turbine can be determined, or respectively calculated, based on neighboring wind turbines in terms of the energy yield.

Correspondingly, with the of division of the wind farm into at least two groups of wind turbines, the group division can also be performed depending on environmental parameters, such as the wind direction, wind strength, air temperature, wind gradients and/or wind turbulence, and possibly also atmospheric pressure, and the results can be stored in order to determine, or respectively to calculate, thusly adaptively and further refining a result that is as accurate as possible for the energy yield potential for the first wind turbine.

Further characteristics of the invention will become apparent from the description of the embodiments according to the invention together with the claims and the included drawings. Embodiments according to the invention can fulfill individual characteristics or a combination of several characteristics.

BRIEF DESCRIPTION OF THE DRAWINGS

The invention is described below, without restricting the general idea of the invention, based on exemplary embodiments in reference to the drawings, whereby we expressly refer to the drawings with regard to the disclosure of all details according to the invention that are not explained in greater detail in the text. The figures show.

In the following figures, the same or similar types of elements or corresponding parts are provided with the same reference numbers so that a corresponding re-introduction can be omitted.

DETAILED DESCRIPTION OF THE INVENTION

Figure 1:
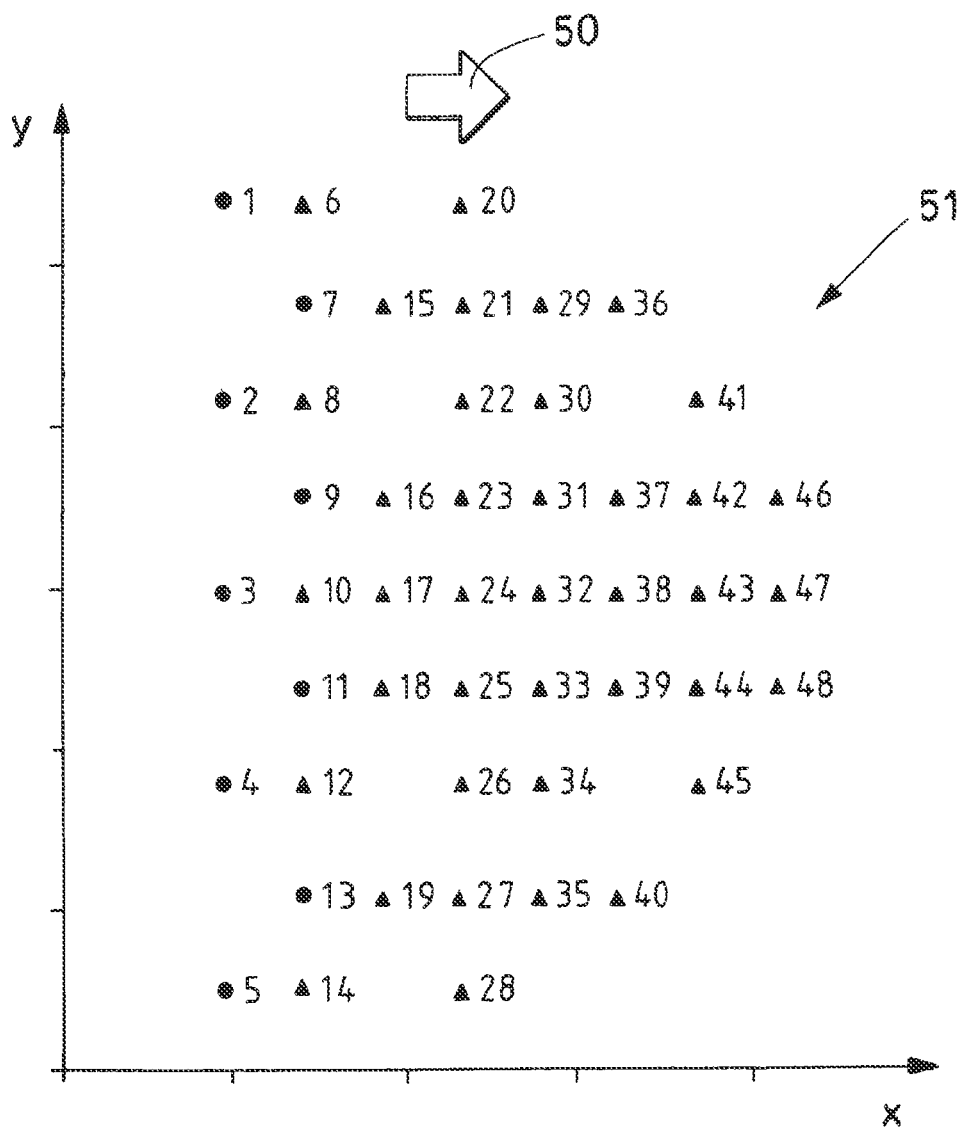
FIG. 1 is a plan view of a wind farm with 48 wind turbines with a specific wind direction.
Figure 2:
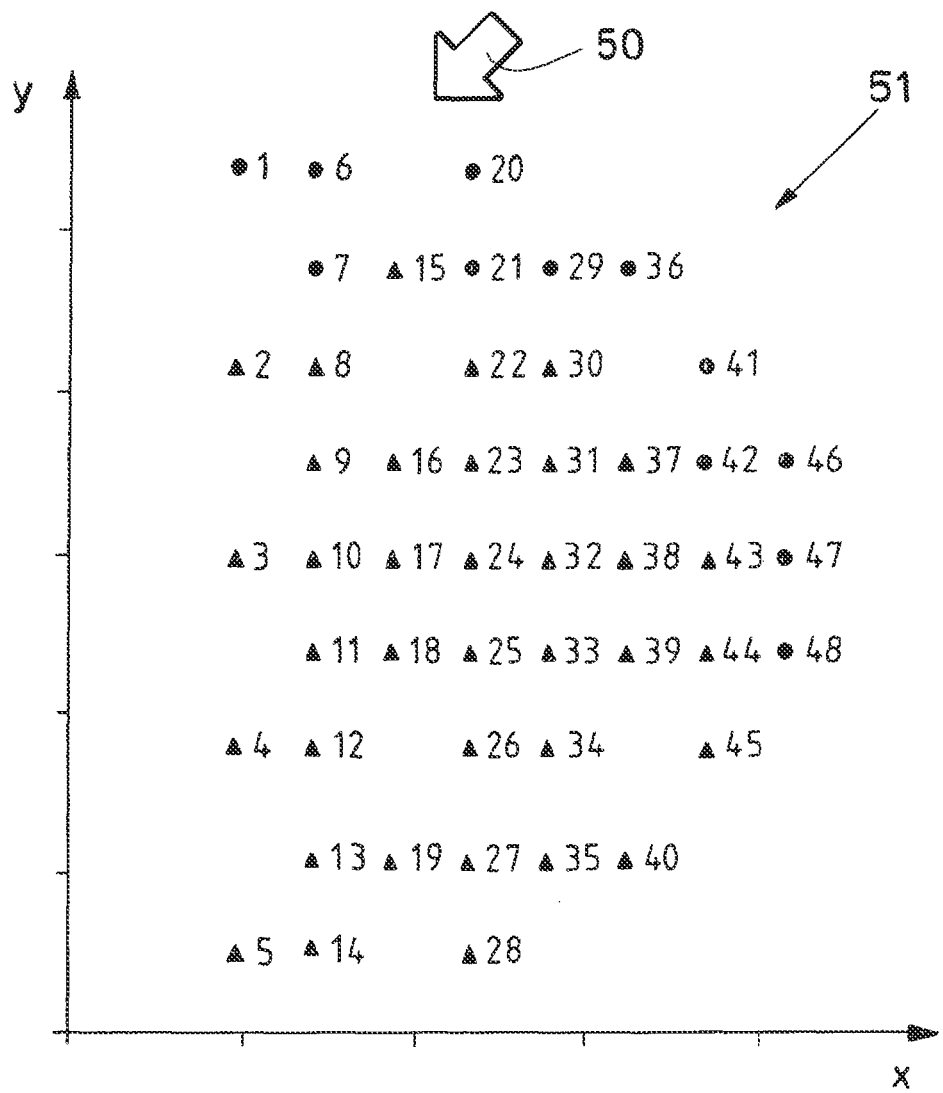
FIG. 2 is a plan view of a wind farm with 48 wind turbines with a wind direction different than that illustrated in FIG. 1.

FIGS. 1 and 2 schematically show a top view of a wind farm 51 with 48 wind turbines. In addition in FIG. 1 and in FIG. 2, a wind 50 is shown with a corresponding schematically represented wind direction. It can be seen that the wind turbines which are provided with a black dot are wind turbines with freely incoming wind 50, and the wind turbines which are provided with a gray triangle are wind turbines with disrupted incoming wind. In the case of FIG. 1 with a wind direction from the left in FIG. 1 according to the wind 50, the wind turbines 1, 2, 3, 4, 5, 7, 9, 11 and 13 encounter freely inflowing wind, and the other wind turbines in the wake turbulence of those wind turbines encountering freely inflowing wind and also the further wind turbines, are thus exposed to disrupted inflowing wind. Correspondingly, the wind turbines 1, 6, 7, 20, 21, 29, 36, 41, 42, 46, 47 and 48 in FIG. 2 with the wind direction of the wind 50 of the FIG. 2, encounter freely inflowing wind, and the further wind turbines encounter disrupted inflowing wind, i.e. disrupted by further wind turbines.

Thus, the wind farm 51 according to FIGS. 1 and 2 is divided into two different groups of wind turbines depending on the wind direction. These are wind turbines which are not influenced by other wind turbines, and wind turbines which are influenced by other wind turbines. According to the invention, it is calculated for each wind direction, for example in increments of 1°, or larger or smaller increments, which wind turbines belong to which group. This can be specified in a first step according to the formula given in the document IEC 6140012-1:

$$\alpha = 1,3 * \arctan\left(2,5 * \frac{D_n}{L_n} + 0,15\right) + 10$$

wherein $\alpha$ is an angle of a disrupted sector, $D_n$ is the rotor diameter of neighboring wind turbines that are operating, $L_n$ is the distance between the wind turbine to be determined and the neighboring turbine that is also in operation. As a second step, an orientation of the disrupted sector is given as follow:

$$\beta = \begin{cases} 90 - \arctan\left(\frac{dy}{dx}\right) f\ddot{u}r & x_0 > x \; und \; y_0 > y \\ 90 + \arctan\left(\frac{dy}{dx}\right) f\ddot{u}r & x_0 > x \; und \; y_0 < y \\ 270 - \arctan\left(\frac{dy}{dx}\right) f\ddot{u}r & x_0 < x \; und \; y_0 < y \\ 270 + \arctan\left(\frac{dy}{dx}\right) f\ddot{u}r & x_0 < x \; und \; y_0 > y \end{cases}$$

wherein $x_0$ is the x-coordinate of the neighboring and operating wind turbine, $y_0$ is the y-coordinate of the neighboring and operating wind turbine, wherein the x and y-coordinates are also shown in the FIGS. 1 and 2. Here, the x-coordinate is the abscissa and the y-coordinate is the ordinate. Correspondingly, x and y are the x-coordinate, or respectively the y-coordinate, of the wind turbine for which it is to be determined whether this wind turbine is disrupted by other wind turbines. dx is the distance along the abscissa between the wind turbine to be determined and the neighboring and operating wind turbine, and correspondingly dy is the distance along the ordinate in this regard. β is the angle between the wind turbine to be determined and the neighboring wind turbine compared to the north direction.

Finally, using the following formula:

$$\gamma = |\beta - v_{dir}| - \frac{\alpha}{2}$$

it can be determined whether the respective wind turbine belongs to the disrupted wind turbines. This is the case if γ has a negative value. Here, γ is the disruption indication angle and $v_{dir}$ is the wind direction. These calculation steps are performed for all wind turbines that are in operation. Only the wind turbines that always have a positive γ belong to the first group of wind turbines, namely the wind turbines with freely inflowing wind. All others belong to the second group of wind turbines for which the wind is not freely inflowing.

In order to now determine the energy yield deficit of a wind turbine at standstill, or respectively operated in a reduced energy yield mode, the respective group division is performed, for example in a 10 minute average value of a wind direction, and the yield deficit of the nonoperational wind turbine, or respectively the wind turbine which is operated in a reduced energy yield mode, is specified as the average value of the energy yield of the further turbines of the corresponding group. Here, a 10 minute time interval can also be considered. For the case that the wind turbine 2, with a wind direction according to FIG. 1, for example, is at standstill, an average value of the energy yield of the wind turbines 1, 3, 4, 5, 7, 9, 11 and 13 is thus formed, and correspondingly the average value of the energy yields, or respectively the effective power, of these wind turbines over a 10 minute interval for example, is the energy yield potential for the wind turbine 2. For the case that the wind turbine 2 is operated only at 50% power, or respectively energy yield, the difference between the possible power and the power actually created, is calculated. Correspondingly the wind turbine operated in a reduced energy yield mode can be a wind turbine from the group of wind turbines with disrupted inflowing wind, so that the energy yield potential of this first wind turbine is formed, for example, by an average value of the determined energy yields of the further wind turbines from this group.

The calculation of the group is calculated precisely to the degree, for example, for each 10 minute interval. The method according to the invention leads to remarkably good results even with complex wind farms, and can be refined also by a larger number of groups. For example, a group 3 can be provided which provides for multiple disruptions. With the embodiment according to FIG. 1, a group 1 can be provided for example, which are the wind turbines which are represented as circles, a group 2 can be provided which includes the wind turbines 6, 8, 10, 12, 14, 15, 16, 18 and 19, and the group 3 represents the further wind turbines. It is possible that this can lead to improved and more accurate results. However, this is not necessarily the case because the complex disruption behavior in the wake of wind turbines, or respectively wind rotors, can also lead to contrary effects, which however depend on the wind direction and the design of the wind farm 51.

Figure 3:
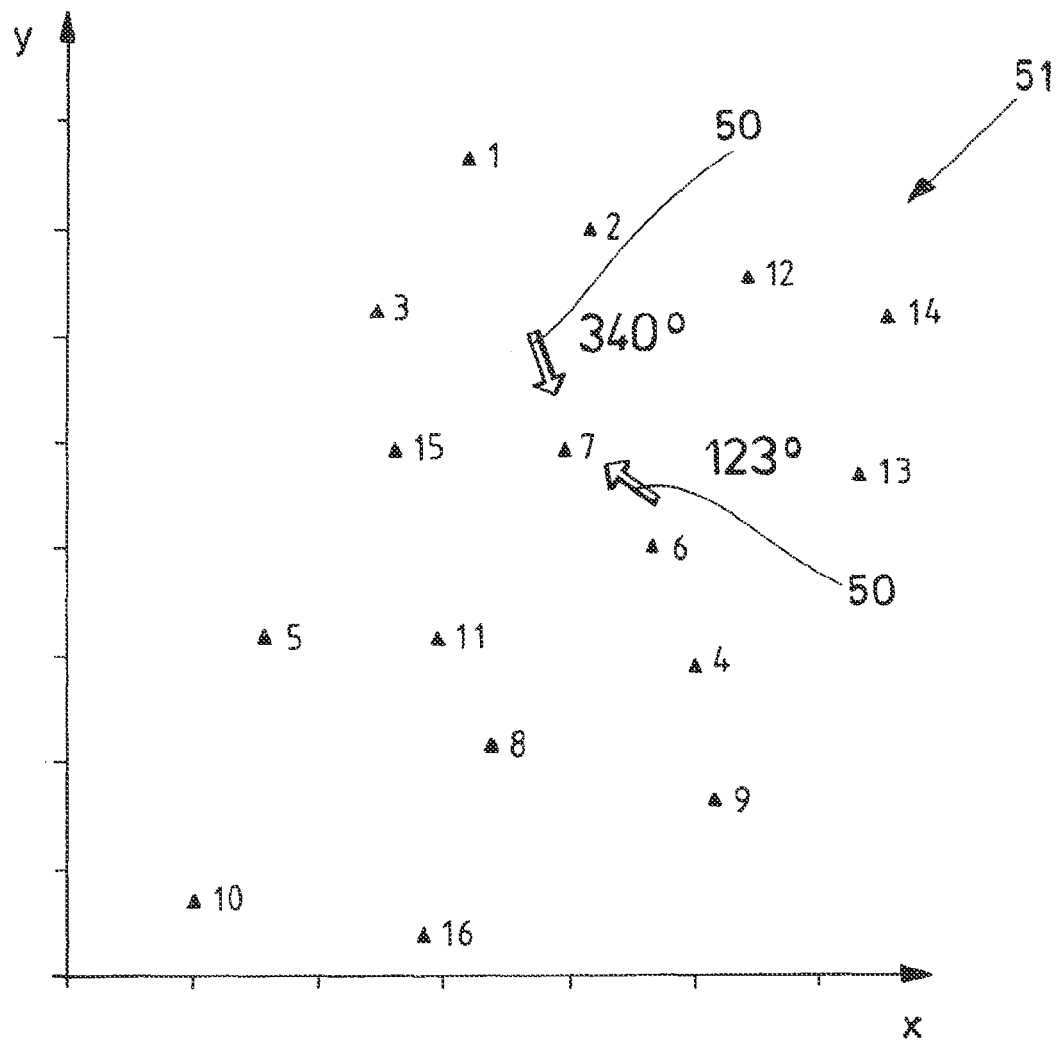
FIG. 3 is a schematic plan view of a further wind farm with 16 wind turbines.

FIG. 3 schematically shows a further wind farm in a schematic top view with an abscissa x and an ordinate y represented. Here, two wind arrows 50 are shown which are arranged at different angles, namely an angle of 123° and an angle of 340°, each relative to the wind direction from the north. Based on the wind farm 51 according to FIG. 3, a ranking list of all wind turbines in the wind farm is to be created depending on their power, or respectively the energy yield and these are shown again depending on the wind direction. This ranking list serves in the case of a failure or a reduction of the energy yield of a wind turbine in order to determine possible energy partners from whose average value, or respectively weighted average value, or respectively by interpolation or extrapolation of the production power, the lost energy quantity can be derived.

The lost quantity of energy is the energy yield potential of a wind turbine at standstill, or respectively the difference of the energy yield potential to the reduced energy yield of this wind turbine, if this turbine is operated in a reduced energy yield mode. With this, fixed local wind turbines are not used as reference, thus wind turbines locally neighboring wind turbines, but rather wind turbines which are the closest in the energy production with given boundary conditions, i.e. given environmental parameters, for instance the wind direction or the wind strength, of the non-producing wind turbine, or respectively the wind turbine operated in the reduced energy yield mode. This embodiment of the invention has the advantage that it is very exact.

Correspondingly the ranking list can also be used for prioritizing maintenance work because only systems with lower yield at a correspondingly present wind direction for example can be serviced.

For the wind farm 51 from FIG. 3 with the 16 wind turbines an energy yield ranking list is created for each wind direction. This can be performed once and be continuously adapted for corresponding wind directions and/or wind strengths and/or other environmental parameters, such that in the case of changes to the wind turbines, for instance software updates, contamination of rotor blades, changes at the site for instance the felling of large trees, the energy yield ranking list 52 is respectively adapted. Here, the following data can be measured, or respectively provided, for instance the wind vane position which is made available, or respectively stored, preferably averaged for all wind vanes of each wind turbine from the energy farm 51, the nacelle position of the respective wind turbine, an effective power, or respectively an energy yield of the respective wind turbine, and the status of the wind turbine whether this is in working or nonworking order. Here too, average values, for example a 10 minute average value, can be used.

Figure 6:
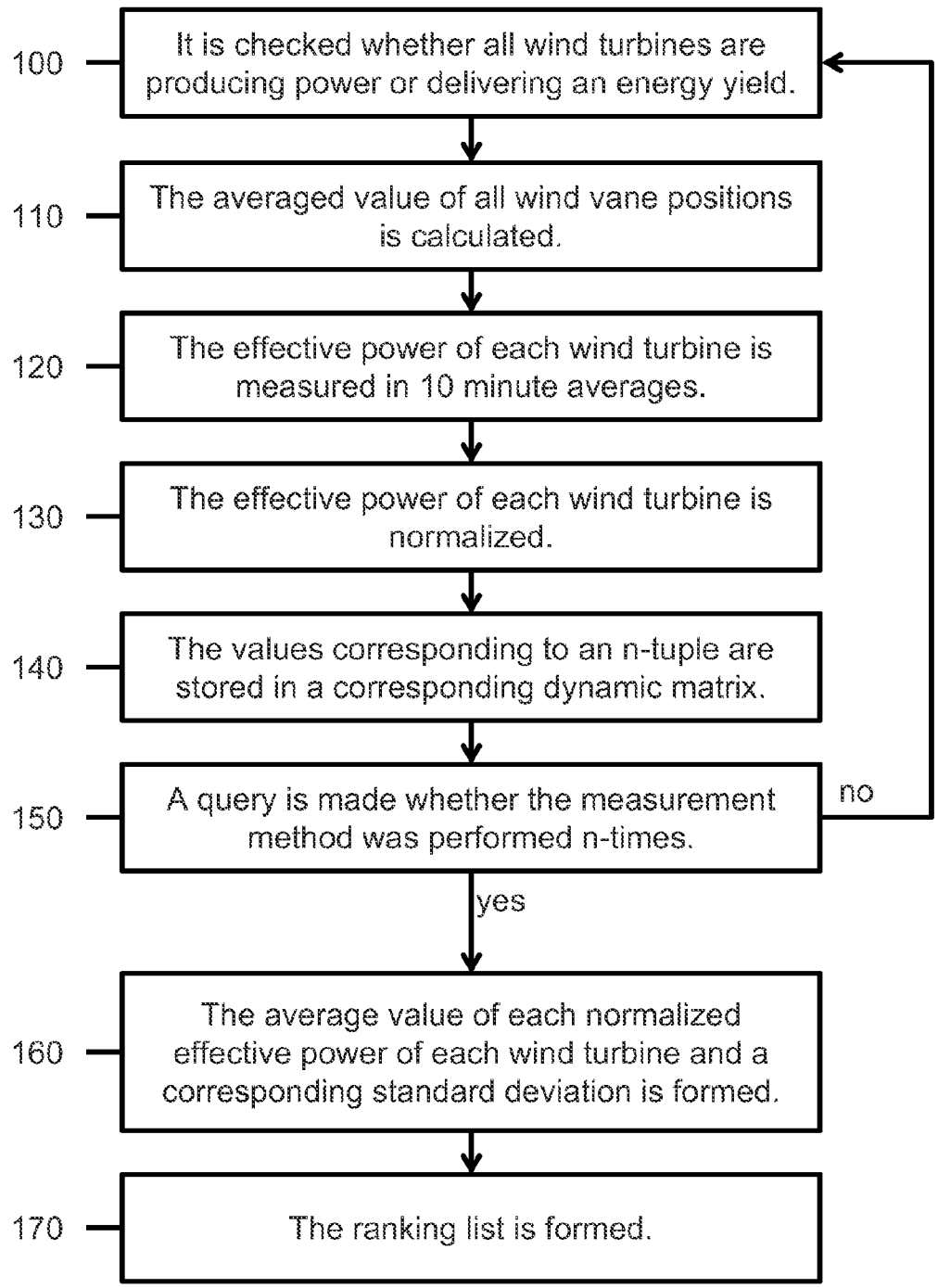
FIG. 6 is a simplified flowchart for forming an energy yield ranking list of wind turbines of a wind farm.

A method for determining an energy yield ranking list 52 is shown schematically for example in FIG. 6. At 100, it is checked whether all wind turbines 1 to 16 are producing power, or respectively delivering an energy yield. At 110, the averaged value of all wind vane positions is calculated. At 120, the effective power of each wind turbine is measured in 10 minute averages; at 130, the effective power of each wind turbine is normalized with the greatest effective power in the wind farm. The greatest effective power in the wind farm is an effective power not determined over 10 minutes, but rather a currently measured effective power. An effective power over a time average can also be provided, and also over a 10 minute average. The normalization occurs for each wind turbine in the wind farm. At 140, the values corresponding to an n-tuple, for instance a 4-tuple, thus four-dimensional, are stored in a corresponding, in particular dynamic, matrix, for example a tuple comprising the wind direction, the number of the wind turbine, the normalized effective power and the number of the measurement, for example the n-th measurement, wherein n is an integer.

At 150 in FIG. 6, a query is made whether the measurement method was performed n-times. The number n can be preset, and is, for example the number 5. However, n can also be 10 or 20. If the response to the question is that this is not the case (n), then the method restarts at 100, and when the question is answered with yes (y), then at 160 the average value of each normalized effective power of each wind turbine and a corresponding standard deviation is formed.

Figure 4:
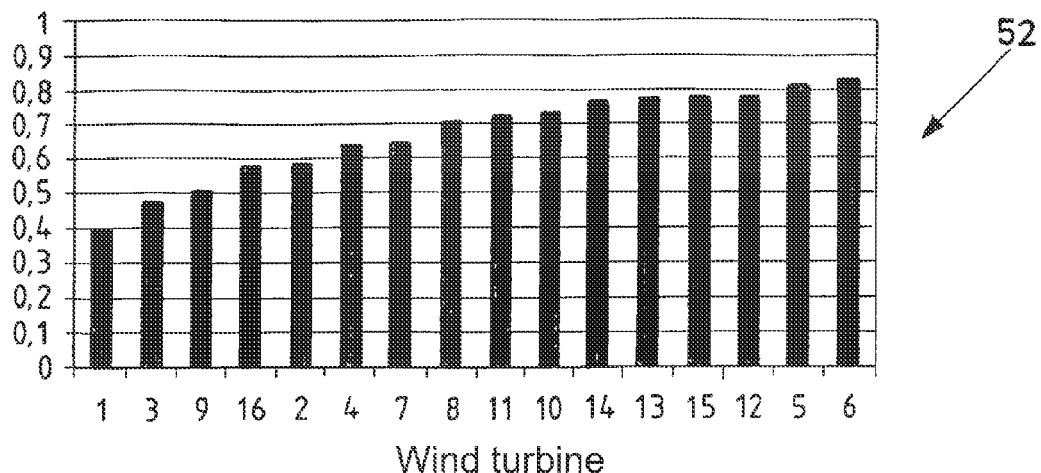
FIG. 4 is a schematic illustration of the energy yield ranking list of the wind farm of FIG. 3 with a wind direction of 123°.
Figure 5:
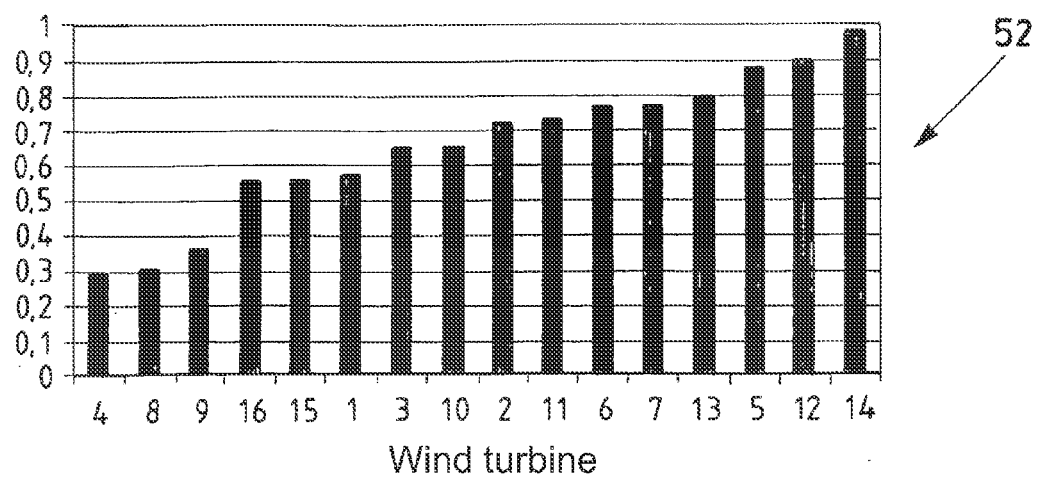
FIG. 5 is a schematic illustration of the energy yield ranking list of the wind farm of FIG. 3 with a wind direction of 340°.

At 170, the ranking list is formed, which is represented for example in FIGS. 4 and 5. Here, the normalized effective power is plotted on the ordinate and the number of respective wind turbines is plotted on the abscissa, wherein the sequence of the wind turbines is given by the energy yield, or respectively power yield. If a wind turbine has a standard deviation of the normalized effective power for the n-measurements that is too large, this wind turbine can be excluded from the ranking list.

The sorting of the ranking list 52 is according to the value of the normalized and averaged effective power. Here, the standard deviation reflects the reliability of the sequence. If the standard deviation values are above a limit value, the scattering is too large, and alternatively the next best reference system, or respectively neighboring wind turbine, should be selected if the standard deviation there is significantly lower.

FIG. 4 schematically shows an energy yield ranking list 52 with a wind direction of 123°, and FIG. 5 schematically shows an energy yield ranking list 52 with a wind direction of 340°. Both of these wind directions are indicated in FIG. 3. A one-year evaluation of the respectively measured data for the wind farm of FIG. 3 provided the respective energy yield ranking list for the different wind directions. FIG. 4 and FIG. 5 are shown as an example.

If the turbine 7 fails, for example, with a wind direction of 123° (see FIG. 4) the energy neighbors 4 and 8 and possibly also 2 and 11 can be used for determining the energy yield deficit, or respectively the energy yield potential. The energy yields, or respectively effective powers, of these producing wind turbines can then be used in order to determine the energy yield potential of the wind turbine 7. This can occur for example by forming an average value, or respectively interpolating or forming a weighted average value. With forming a weighted average value, for example, the energy yield of the wind turbines 4 and 8 would be evaluated as twice the strength of the energy yield of the wind turbines 2 and 11.

With a wind direction of 340° (see FIG. 5) the immediate energy neighbors of wind turbine 7 are the wind turbines 6 and 13, and the correspondingly somewhat further distanced energy neighbors, the wind turbines 11 and 5. Correspondingly then, the energy yield potential of the wind turbine 7 can be determined using the energy yields of these wind turbines (11 and 5, as well as 6 and 13). With this, the average value of the effective powers of the energy neighbors can be referred to for the relevant time of the standstill of a first wind turbine, in order to determine the energy quantity which the wind turbine 7 would have produced for example. Energy neighbors are preferably up to a maximum of 5 neighboring wind turbines in one direction.

A particularly advantageous method further provides that for the determination of the energy neighbors it is additionally checked whether the energy neighbor lies in the wake turbulence, or respectively the wake, of the first wind turbine (here turbine 7). This check can be performed analogously to the formulas which were specified above for determining the wind turbines of the group 2. If the energy neighbor lies in the immediate wake, it is excluded from the calculation because it is to be expected that the energy yield changes significantly due to the failure of the first wind turbine. The next energy neighbor then is referred to for the method, possibly with consideration of a weighting factor. This embodiment significantly increases the method accuracy for wind farms in a level site. For wind farms at hilly sites, the result can also be more accurate, even without this additional check.

A strategy for prioritizing maintenance can also be derived. Planned standstill times, for instance, an annual maintenance or an oil change, can be performed, for example with wind 340°, preferably for turbine 4 or 8, and not for turbine 12 or 14.

All named characteristics, including those taken from the drawings alone, and individual characteristics, which are disclosed in combination with other characteristics, are considered individually and in combination as essential to the invention. Embodiments according to the invention can be fulfilled through individual characteristics or a combination of several characteristics.

REFERENCE LIST

1-48 wind turbine
50 wind
51 wind farm
52 energy yield ranking list
100 check, whether all wind turbines are producing
110 calculation of the average value of all wind vane positions
120 measurement of the effective power of each wind turbine in 10 minute intervals
130 normalization of the effective power of the wind turbine with the greatest power in the farm
140 storing the values in a four dimensional dynamic matrix, for example (wind direction/wind turbine/normalized effective power/n-th measurement)
150 query performed n times
160 form the average value and standard deviation
170 form the ranking list

The invention claimed is:

1. A method for determining an energy yield loss of a first wind turbine of a wind farm comprising a plurality of wind turbines, the method comprising:
   operating the first wind turbine in a reduced energy yield mode that is outside an energy-optimized normal operating mode;
   determining a reduced energy yield of the first wind turbine;
   selecting at least one second wind turbine according to a predeterminable criterion;
   determining the energy yield of the at least one second wind turbine; and
   determining an energy yield potential of the first wind turbine depending upon the energy yield of the at least one second wind turbine,
   determining a difference between the energy yield potential of the first wind turbine and the determined reduced energy yield.

2. The method according to claim 1, further comprising:
   selecting at least two of the second wind turbines; and
   determining the energy yield of the at least two second wind turbines,
   wherein depending upon the energy yields of the at least two second wind turbines the energy yield potential of the first wind turbine is determined.

3. The method according to claim 2, wherein for determining the energy yield potential of the first wind turbine, the energy yields of the at least two second wind turbines are at least one of interpolated, extrapolated, and averaged.

4. The method according to claim 1, wherein the method is performed completely automatically.

5. The method according to claim 1, wherein the operation of the first wind turbine in the reduced energy yield mode is a standstill or a powerless operation of the first wind turbine.

6. The method according to claim 1, wherein the wind farm is divided into at least a first and a second group of wind turbines, and the first wind turbine and the at least one second wind turbine originate from the same group.

7. The method according to claim 6, wherein the first group of wind turbines comprises wind turbines with freely inflowing wind, and the second group of wind turbines comprises wind turbines with disrupted inflowing wind.

8. The method according to claim 1, wherein an energy yield ranking list of the wind turbines of the wind farm is formed.

9. The method according to claim 8, wherein the at least one second wind turbine is neighboring to the first wind turbine in the energy yield ranking list.

10. The method according to claim 8, further comprising:
   creating a matrix that has the energy yield ranking list depending on the wind direction.

11. The method according to claim 1, wherein the energy yield potential of the first wind turbine depends on at least one environmental parameter.

12. The method according to claim 1, wherein for the determination of the energy yield potential of the first wind turbine, only the at least one second wind turbines is used that is operated in an energy-optimized normal operating mode.

13. The method according to claim 1, wherein an additional criterion of the selection of the second wind turbine is a comparatively low standard deviation of a determined effective power of the second wind turbine compared to at least one further second wind turbine.

* * * * *